US005466639A

United States Patent [19]

Ireland

[11] Patent Number: 5,466,639
[45] Date of Patent: Nov. 14, 1995

[54] DOUBLE MASK PROCESS FOR FORMING TRENCHES AND CONTACTS DURING THE FORMATION OF A SEMICONDUCTOR MEMORY DEVICE

[75] Inventor: Philip J. Ireland, Nampa, Id.

[73] Assignee: Micron Semiconductor, Inc., Boise, Id.

[21] Appl. No.: 319,217

[22] Filed: Oct. 6, 1994

[51] Int. Cl.⁶ .............................. H01L 21/44; H01L 21/48
[52] U.S. Cl. ..................... 437/195; 437/228; 437/235; 148/DIG. 106
[58] Field of Search ................................ 437/195, 228, 437/231, 235; 148/DIG. 106

[56] References Cited

U.S. PATENT DOCUMENTS

| | | | |
|---|---|---|---|
| 4,997,789 | 3/1991 | Keller et al. | 437/192 |
| 5,055,423 | 10/1991 | Smith et al. | 437/187 |
| 5,354,711 | 10/1994 | Heitzmann et al. | 437/182 |
| 5,397,908 | 3/1995 | Dennison et al. | 257/306 |
| 5,403,781 | 4/1995 | Matsumoto et al. | 437/195 |

OTHER PUBLICATIONS

Ueno et al, "A Quarter–Micron Planarized Interconnection Technology with Self–Aligned Plug", Apr. 1992 IEEE, pp. 305–308.

Kaanta et al., "Dual Damascene: A ULSI Wiring Technology", Jun. 11–12, 1991 IEEE, VMIC Conference, pp. 144–152.

Primary Examiner—Olik Chaudhuri
Assistant Examiner—H. Jey Tsai
Attorney, Agent, or Firm—Kevin D. Martin

[57] ABSTRACT

A method of forming contact to a semiconductor memory device feature comprises the steps of forming a first oxide layer over a feature such as a semiconductor substrate or a conductive line or plate, then forming a hard mask over the first oxide layer. A first patterned resist layer is formed on the hard mask, then the hard mask is patterned using the first resist layer as a pattern. The first resist layer is removed and a second oxide layer is formed over the hard mask. A second patterned resist layer is formed over the second oxide layer and the second oxide layer is etched using the second resist layer as a pattern while, during a single etch step, the first oxide layer is etched using the hard mask as a pattern, the hard mask functioning as an etch stop. The second resist layer is removed and a conductive layer is formed over the second dielectric layer and the hard mask, with the conductive layer (including any adhesion layers required to adhere the conductive layer to the underlying layer), contacting the feature and forming contacts. The conductive layer is then planarized.

20 Claims, 4 Drawing Sheets

DOUBLE MASK PROCESS FOR FORMING TRENCHES AND CONTACTS DURING THE FORMATION OF A SEMICONDUCTOR MEMORY DEVICE

FIELD OF THE INVENTION

This invention relates to the field of semiconductor manufacture, and more specifically to the formation of contacts and trenches in a dielectric material.

BACKGROUND OF THE INVENTION

During the formation of a semiconductor device, layers of various materials such as dielectrics, masks, metals, doped polycrystalline silicon, and photoresist are formed over a semiconductor substrate. Contacts through dielectric materials to the semiconductor substrate are typically required during the formation of semiconductor devices, such as memory devices and microprocessors. Contacts to features other than the substrate, such as word lines and other structures, are also commonly performed.

One process to form a contact to a semiconductor substrate or other features through a dielectric includes the step of forming a dielectric layer over the semiconductor substrate, then forming a first patterned layer of photoresist (resist) over the dielectric. An etch defines a contact through the dielectric to the substrate, and the resist layer is then removed.

The contacts are often connected with word lines or bit lines. To form the word or bit lines a second layer of resist is patterned over the dielectric layer leaving the contacts exposed, and also leaving exposed an area parallel and overlying the contacts. The dielectric is again etched, although the dielectric is not etched completely, thereby creating a trench in the dielectric but no additional contacts to the substrate. A layer of conductive material such as metal is then blanket deposited over the surface of the dielectric, and the wafer is planarized to leave conductive material within the contacts and within the trench.

Various problems are associated with processes such as the one described above. One problem is that the dielectric is etched to expose the substrate, then a second patterned resist layer is subsequently formed over the dielectric thus filling the contacts with resist. Due to the small sizes of the contacts in the dielectric, it can be difficult to completely remove the resist from the contacts in the dielectric, and thus the conductive layer which contacts the substrate may not make adequate electrical contact.

One method to solve the problem associated with resist filling the contact has been to first etch a contact in a first dielectric layer, then to deposit and planarize a first metal layer to form a metal plug to the substrate. A second dielectric layer having a trench is patterned over the first metal layer and over the first dielectric layer, then a second metal layer is formed over the second dielectric layer and then planarized. This process, however, requires the formation and planarization of two metal layers, thus adding additional steps and an additional metal-to-metal interface, which can be difficult to form reliably.

A process which can be accomplished by the deposition of a single metal layer and does not require the formation of a resist layer within the contact to the substrate would be desirable.

SUMMARY OF THE INVENTION

A method of forming a semiconductor device comprises the steps of forming a first dielectric layer over a feature such as a semiconductor substrate or a conductive line or plate, then forming a hard mask over the first dielectric layer. A first patterned resist layer is formed directly on the hard mask, and the hard mask is patterned using the first resist layer as a pattern. The first resist layer is removed.

Next, a second dielectric is formed over the hard mask, and a second patterned resist layer is formed over the second dielectric layer. The second dielectric layer is etched using the second resist layer as a pattern. Finally, the first dielectric layer is etched using the hard mask as a pattern.

Objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
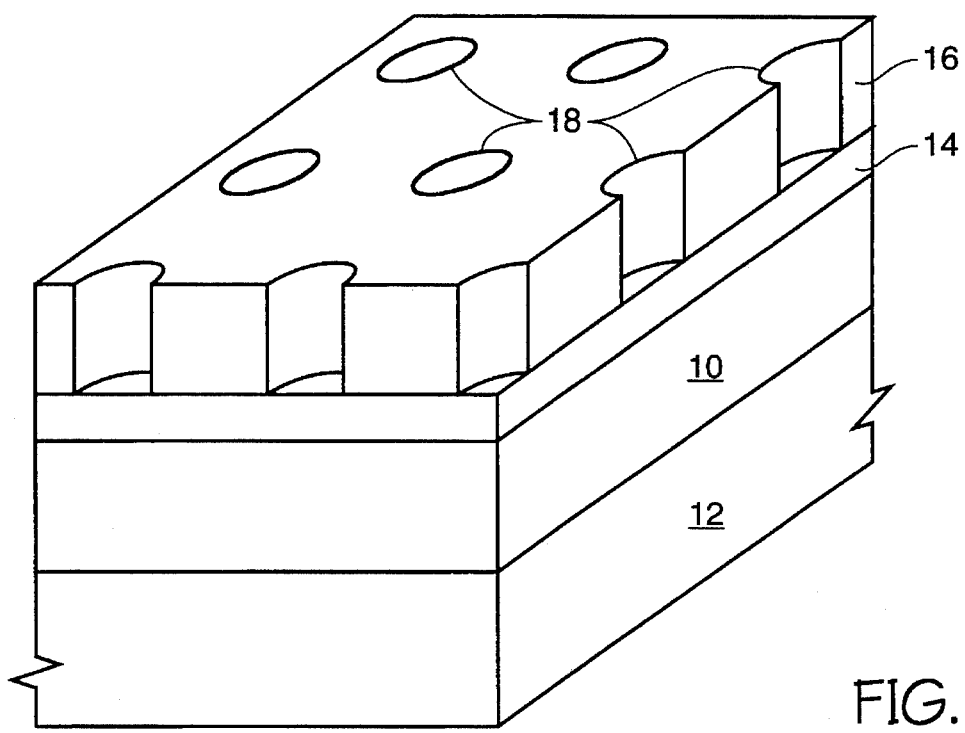
FIGS. 1–8 are isometric views showing one possible embodiment of the inventive process.

Referring to FIG. 1, a method of forming a semiconductor device comprises the steps of forming a first dielectric layer 10, such as an oxide such as borophosphosilicate glass (BPSG), over a semiconductor substrate 12 such as a wafer of silicon or gallium arsenide. A hard mask 14, such as a thermal layer of silicon nitride, is then formed over the first dielectric layer 10. A hard mask, for purposes of this disclosure, is a layer which can be etched selective to the underlying dielectric layer. Various materials other than thermal silicon nitride may be used for the hard mask.

Figure 2:
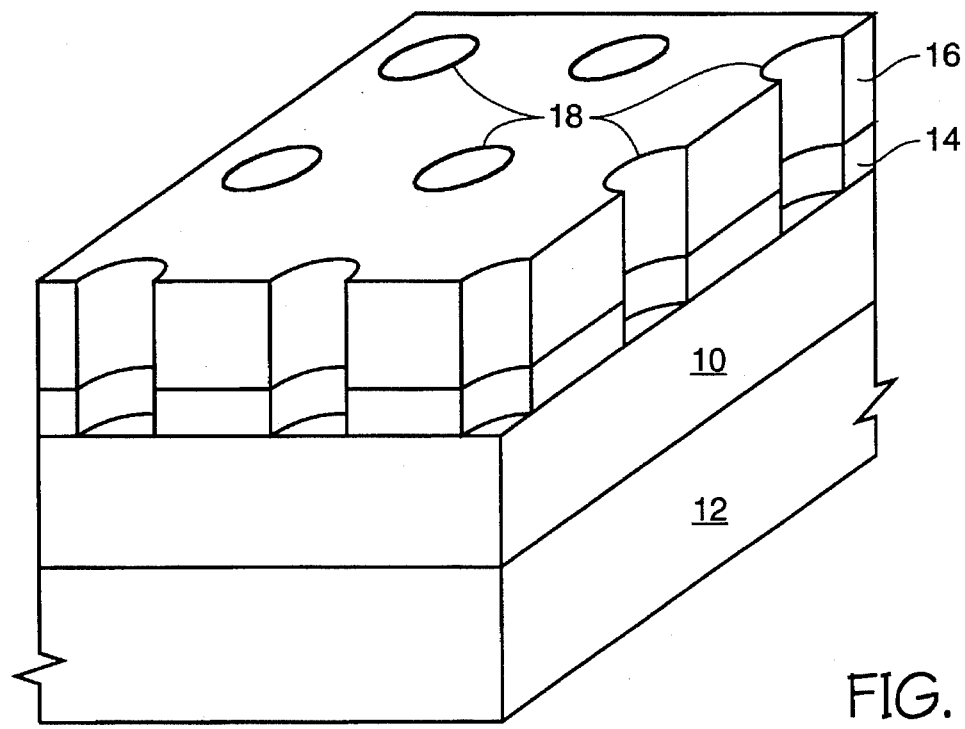
Figure 3:
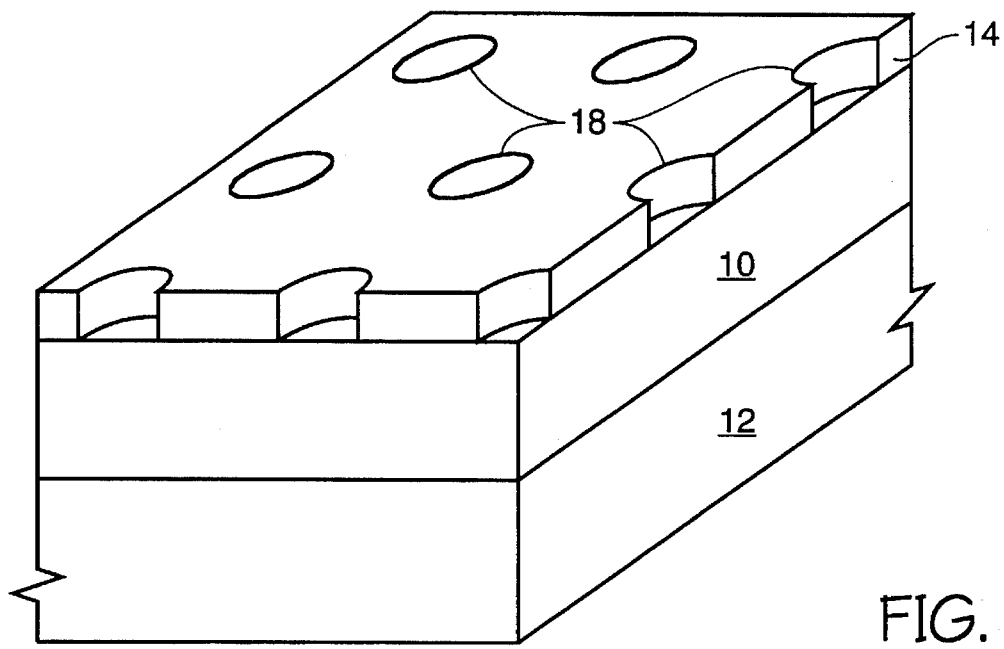

Next, a first patterned layer of photoresist (resist) 16 having contact locations 18 is formed on the hard mask 14, and the hard mask is patterned using the first resist layer as a pattern as shown in FIG. 2 which leaves the contact locations 18 etched in the hard mask 14. The patterning of the hard mask 14 can be accomplished by any means which removes the hard mask and leaves the underlying dielectric layer substantially intact. Either a wet or dry etch using materials known in the art would be sufficient, depending on the hard mask and the dielectric layers used. The first resist layer 16 is then stripped as shown in FIG. 3.

Figure 4:
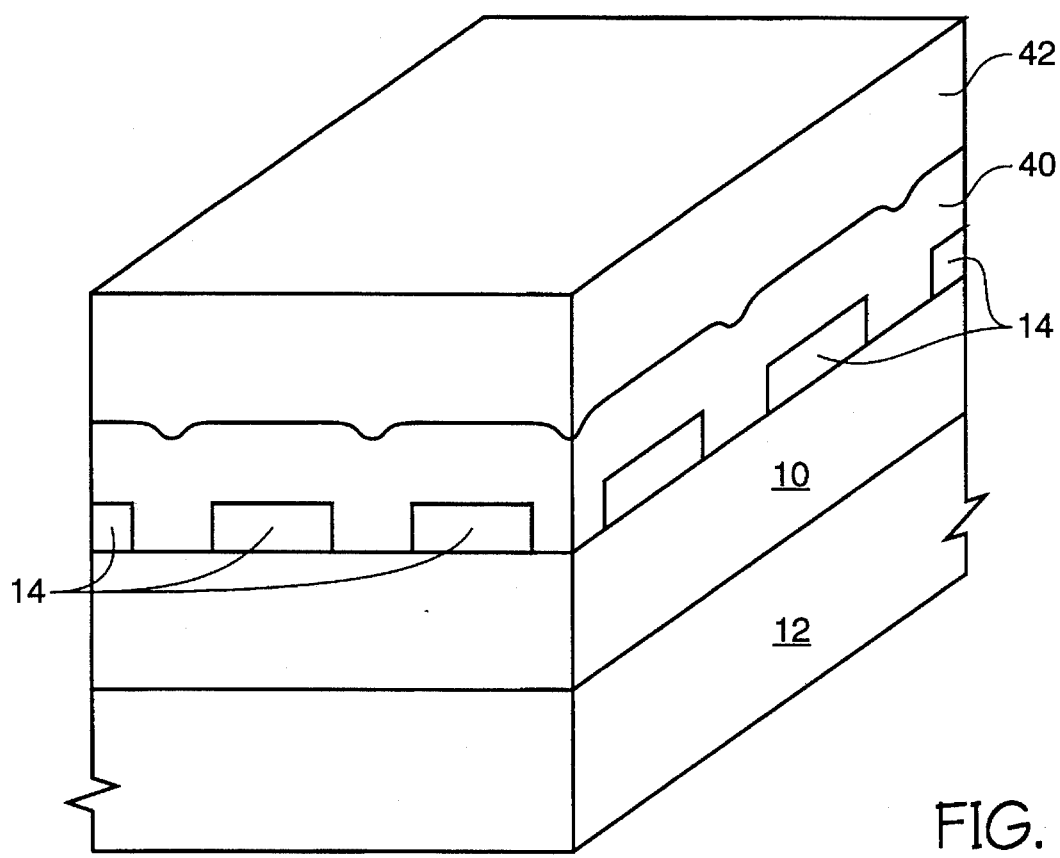
Figure 5:
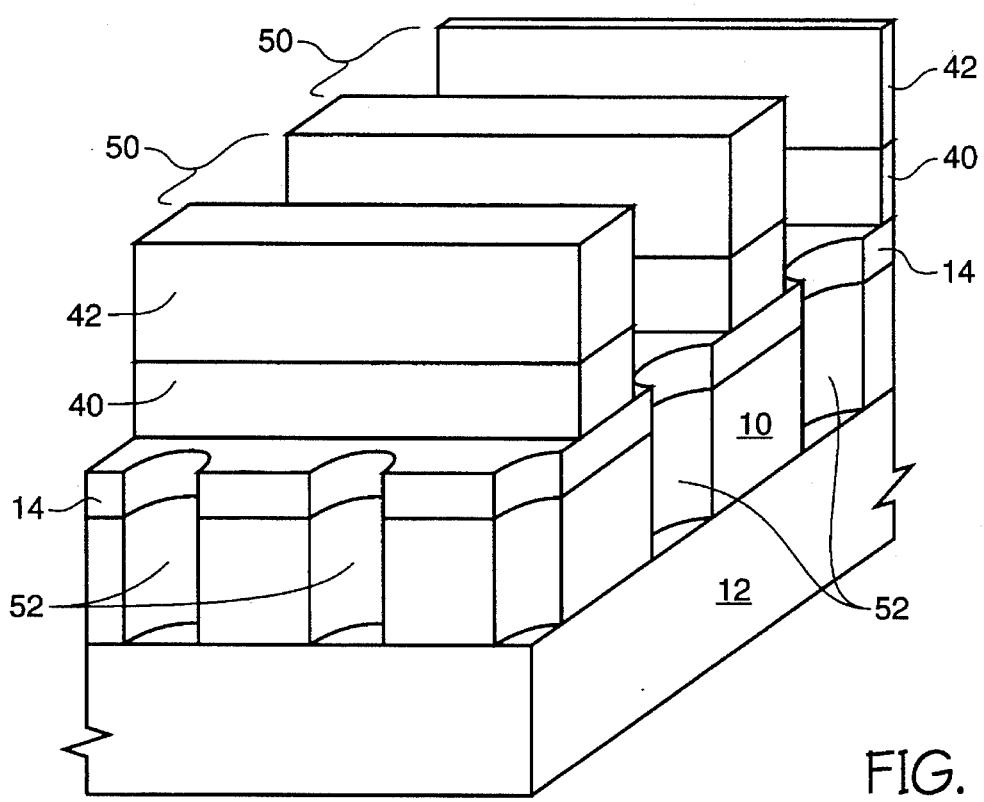

As shown in FIG. 4, a second dielectric layer 40 is formed over the hard mask 14, and a second resist layer 42 is formed over the second dielectric layer 40. As shown in FIG. 5, the resist 42 is patterned and the second dielectric layer 40 is etched using the second resist layer 42 as a pattern, which forms a trench 50 in the second dielectric layer 40. The hard mask 14 functions as an etch stop layer, thereby preventing the trench 50 from being etched into the first dielectric layer 10. The first dielectric layer 10 is then etched using the hard mask 14 as a pattern to form a contact 52 in the first dielectric layer 10 to the substrate 12. The etching of the first 10 and second 40 dielectric layers can be performed during two different etch steps, or it may be preferable to etch the two layers during a single etch step.

Figure 6:
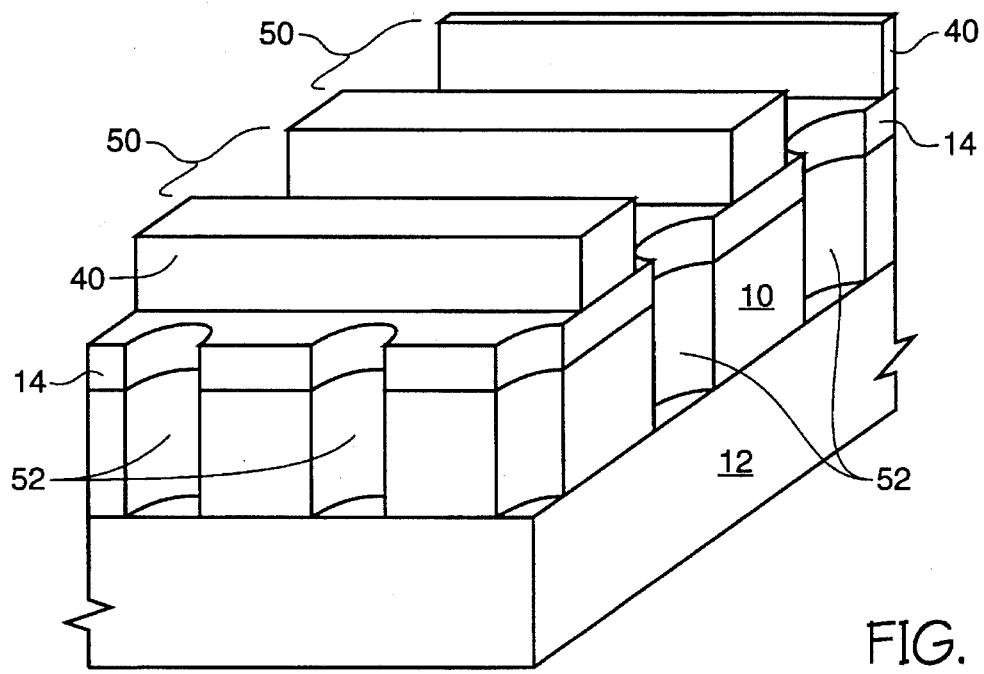
Figure 7:
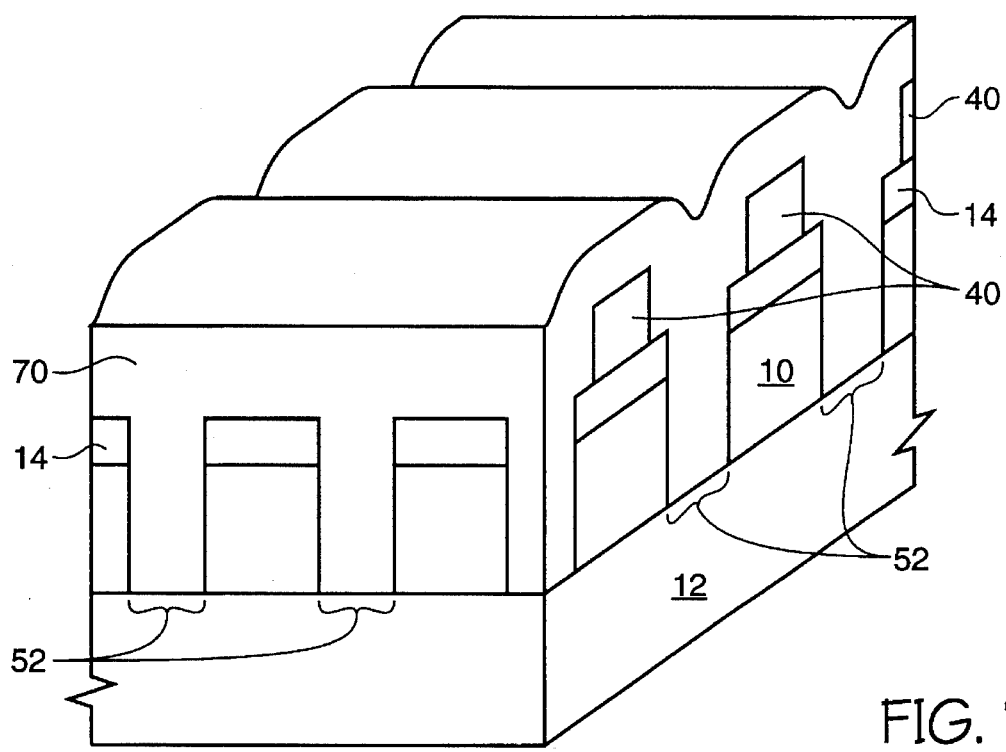
Figure 8:
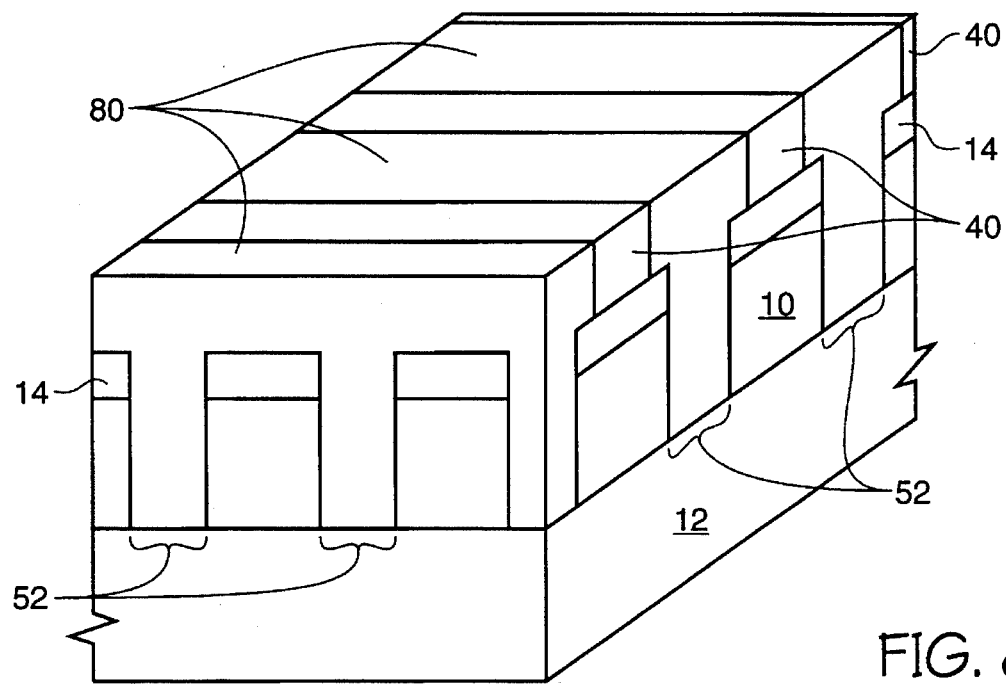

In any case, the second resist layer 42 is removed as shown in FIG. 6, and, referring to FIG. 7, a conductive layer 70 (including any adhesion layers, not shown, required to adhere the conductive layer to the underlying layer), such as a metal layer is formed over the hard mask 14 and over the first 10 and second 40 dielectric layers. The conductive layer 70 fills the contact 52 in the first dielectric layer 10 and the trench 50 in the second dielectric layer 40. Planarizing the conductive layer 70 electrically isolates one trench from the next, to form conductive lines 80 such as word lines or bit lines as shown in FIG. 8. The conductive layer can be planarized by any workable means, such as by chemical mechanical polish, a dry etch, etc.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, the formation of a contact to a semiconductor substrate is shown, the process can be used to form a contact to any feature, such as a conductive line or plate. It is therefore contemplated that the appended claims will cover any such modifications or embodiments as fall within the true scope of the invention.

What is claimed is:

1. A method for forming contact to a semiconductor device feature comprising the following steps:
   a) forming a first dielectric layer over a feature to be contacted;
   b) forming a mask over said first dielectric layer;
   c) forming a first patterned resist layer on said mask;
   d) patterning said mask using said first resist layer as a pattern;
   e) removing said first resist layer; then
   f) forming a second dielectric layer over said mask;
   g) forming a second patterned resist layer over said second dielectric layer;
   h) etching said second dielectric layer using said second resist layer as a pattern; then
   i) etching said first dielectric layer using said mask as a pattern.

2. The method of claim 1 wherein steps h) and i) are performed during a single etch step.

3. The method of claim 1, further comprising the following steps:
   j) removing said second resist layer;
   k) forming a conductive layer over said mask and over said first and second dielectric layers;
   l) planarizing said conductive layer.

4. The method of claim 3 wherein said conductive layer is metal and is formed as a single layer to form metal contacts to said feature and conductive lines.

5. The method of claim 4 wherein said conductive lines are bit lines.

6. The method of claim 4 wherein said conductive lines are word lines.

7. The method of claim 1 wherein said dielectric layer is oxide and said mask is silicon nitride.

8. The method of claim 1 wherein said mask functions as an etch stop layer during step h).

9. A method for forming contact to a semiconductor device feature comprising the following steps:
   a) forming a first oxide layer over a feature to be contacted;
   b) forming a mask over said first oxide layer;
   c) forming a first patterned resist layer on said mask;
   d) patterning said mask using said first resist layer as a pattern;
   e) removing said first resist layer; then
   f) forming a second oxide layer on said mask;
   g) forming a second patterned resist layer over said second oxide layer;
   h) etching said second oxide layer using said second resist layer as a pattern; then
   i) etching said first oxide layer using said mask as a pattern;
   j) forming a conductive layer over said first and second oxide layers;
   k) planarizing said conductive layer.

10. The method of claim 9 wherein steps h) and i) are performed with a single etch step.

11. The method of claim 9 wherein said conductive layer is metal, and a single metal layer is formed over said first and second oxide layers to form metal contacts to said feature and conductive lines.

12. The method of claim 11 wherein said conductive lines are bit lines.

13. The method of claim 11 wherein said conductive lines are word lines.

14. The method of claim 11 wherein said mask is silicon nitride.

15. The method of claim 9 wherein said mask functions as an etch stop during step h).

16. A method for forming contact to a semiconductor device feature during the formation of a semiconductor memory device comprising the following steps:
   a) forming a first oxide layer over a feature to be contacted;
   b) forming a mask over said first oxide layer;
   c) forming a first patterned resist layer on said mask;
   d) patterning said mask using said first resist layer as a pattern;
   e) removing said first resist layer; then
   f) forming a second oxide layer over said mask;
   g) forming a second patterned resist layer over said second oxide layer;
   h) etching said second oxide layer using said second resist layer as a pattern and etching said first oxide layer using said mask as a pattern during a single etch step, said mask functioning as an etch stop;
   i) removing said second resist layer;
   j) forming a conductive layer over said second oxide layer and said mask, said conductive layer contacting said feature and forming contacts;
   k) planarizing said conductive layer.

17. The method of claim 16 wherein said conductive layer comprises metal and a single metal layer is formed over said first and second oxide layers to form metal contacts to said feature and conductive lines.

18. The method of claim 17 wherein said conductive lines are bit lines.

19. The method of claim 17 wherein said conductive lines are word lines.

20. The method of claim 16 wherein said mask is silicon nitride.

* * * * *